United States Patent [19]

Nakata et al.

[11] Patent Number: 5,497,047
[45] Date of Patent: Mar. 5, 1996

[54] FLUORESCENT DISPLAY DEVICE

[75] Inventors: Hisashi Nakata; Yoshihisa Yonezawa; Yasuhiro Nohara, all of Mobara, Japan

[73] Assignee: Futaba Denshi Kogyo K.K., Mobara, Japan

[21] Appl. No.: 188,725

[22] Filed: Jan. 31, 1994

[30] Foreign Application Priority Data

Jan. 29, 1993 [JP] Japan .................. 5-006060 U

[51] Int. Cl.$^6$ .................................. H01J 1/62
[52] U.S. Cl. .................. 313/493; 313/571; 313/581; 313/634
[58] Field of Search .................. 313/493, 573, 313/517, 581, 626, 634, 332, 495, 497; 315/169.4; 345/37, 60

[56] References Cited

U.S. PATENT DOCUMENTS 4,100,456  7/1978  Kobayakawa et al. .......... 313/497
4,855,640  8/1989  Caple ........................ 313/495 X Primary Examiner—Sandra L. O'Shea
Assistant Examiner—Ashok Patel
Attorney, Agent, or Firm—Oblon, Spivak, McClelland, Maier & Neustadt

[57] ABSTRACT

A fluorescent display device capable of realizing mounting of a semiconductor element on a substrate while ensuring an increase in moisture resistance, a decrease in contact resistance at connection between the semiconductor element and a wiring conductor and increased reliability. A semiconductor element is mounted on an extension of a substrate and received in a mounting chamber formed by cooperation of a sealing material, a face plate and the substrate. The semiconductor element is downwardly pressed against the substrate by the face plate, resulting in the semiconductor element being electrically connected to a wiring conductor. The sealing material is made of an inorganic material such as indium-tin alloy or the like which has an operating temperature lower than a sealing medium.

3 Claims, 2 Drawing Sheets

FLUORESCENT DISPLAY DEVICE

BACKGROUND OF THE INVENTION

This invention relates to a fluorescent display device which includes a semiconductor element for driving arranged on an extension of a substrate constituting a part of a hermetic envelope which is formed at the substrate so as to be positioned outside the envelope, and more particularly to a fluorescent display device which permits the semiconductor element to be removed even after it is mounted on the fluorescent display device.

A fluorescent display device is requested to provide a display of high density. Concurrently, the fluorescent display device is requested to simplify lead wires for feeding the fluorescent display device with an electric power therethrough to facilitate lead-in and lead-out of the lead wires. For this purpose, the fluorescent display device is often constructed in such a manner that a semiconductor element for driving is mounted on an outside of an envelope or an extension of a substrate constituting a part of the envelope which is formed at the substrate so as to be positioned outside the envelope.

A way in which the semiconductor element is mounted directly on the substrate to connect a wiring on the substrate to a terminal of the semiconductor element includes a face-down procedure. The face-down procedure is classified into some types.

One of the types of the face-down procedure is to use a conductive adhesive material. More particularly, this is to connect metal bumps of the semiconductor element through a conductive adhesive material to terminals on the substrate and then seal them by means of epoxy resin or the like.

Another type is practiced using an anisotropic conductive sheet, wherein a film having conductive particles uniformly dispersed in an adhesive material is interposedly arranged between bumps of the semiconductor element and terminals on the substrate and subject to a heating treatment under pressure, resulting in connection between both being carried out through the conductive particles.

A further type of the face-down procedure is to utilize direct connection by means of Au bumps. This is to connect Au bumps of the semiconductor element to terminals on the substrate and then seal them by means of epoxy resin or the like.

In addition, other connection ways such as connection by soldering, connection using conductive plated resin balls and the like may be employed for this purpose.

Now, an example of a manner in which the semiconductor element for driving is arranged on the substrate of the fluorescent display device will be described with reference to FIGS. 2 and 3.

A fluorescent display device shown in FIGS. 2 and 3, includes a substrate 1 made of a glass plate or the like, which is provided on an inner surface thereof with an anode conductor 2 for forming a display pattern. For this purpose, the anode conductor 2 is provided thereon with phosphor layers 3. Also, the fluorescent display device includes a wiring conductor 2a electrically connected to the anode conductor and other electrodes during formation of the anode conductor 2. The wiring conductor 2a is covered with an insulating layer 4.

Further, the fluorescent display device includes control electrodes 5 arranged above the substrate 1 and cathodes 6 stretchedly arranged above the substrate 1 and control electrodes 5 through supports 9.

The substrate 1 is integrally joined to side plates 7 and a front cover 8 by means of a sealing medium made of low-melting frit glass, resulting in a hermetic envelope being formed. The joining operation using the sealing medium is carried out at an operating temperature of about 400° C. sufficient to permit residual gas in the envelope to be discharged therefrom.

In the fluorescent display device thus constructed, electrons emitted from the cathodes 6 are selectively impinged on the phosphor layers while be selectively controlled by the control electrodes 5, resulting in providing a desired luminous display.

The substrate 1 is arranged so as to outwardly extend at a part thereof from the hermetic envelope, to thereby provide an extension 1a on which a semiconductor element 12 is supportedly mounted as described below. The wiring conductor 2a is arranged so as to extend onto the support section 1a. The semiconductor element 12 is provided with connections 13 and the insulating layer 4 is formed with an opening in a manner to positionally correspond to each of the connections 13 of the semiconductor element 12, through which opening the wiring conductor 2a is exposed. Mounting of the semiconductor element 12 on the extension 1a of the substrate 1 is carried out in such a manner that electrical connection between the wiring conductor 2a and the semiconductor element 12 is executed by means of conductive adhesive as described above and then sealed by means of resin 14 such as epoxy resin or the like.

Unfortunately, sealing of the semiconductor element 12 using the epoxy resin 14 causes a failure in insulation of the semiconductor element due to deterioration in moisture resistance of the resin and tight adhesion between the resin and the substrate.

Also, use of the conductive adhesive or anisotropic conductive sheet leads to an increase in contact resistance between the metal bumps of the semiconductor element 12 and the wiring conductor 2a on the substrate 1.

Further, direct connection between the semiconductor element and the terminals by means of the Au bumps or using the conductive plated resin balls permits the contact resistance to be somewhat reduced. However, such connection deteriorates reliability in the connection due to a failure in an increase in pressing force of the semiconductor element 12 against the wiring conductor 2a because the pressing force is basically determined depending on shrinkage force of the resin.

Furthermore, the connection by soldering described above fails to accommodate to high density mounting.

SUMMARY OF THE INVENTION

The present invention has been made in view of the foregoing disadvantages of the prior art.

It is an object of the present invention to provide a fluorescent display device which is capable of permitting mounting of a semiconductor element on an extension of a substrate extending to an outside of an envelope to be satisfactorily accomplished.

It is another object of the present invention to provide a fluorescent display device which is capable of realizing mounting of a semiconductor element on an extension of a substrate positioned outside of an envelope while ensuring an increase in moisture resistance, a decrease in contact resistance at connection between the semiconductor element and a wiring conductor and increased reliability.

In accordance with the present invention, a fluorescent display device is provided. The fluorescent display device includes a body assembled by means of a sealing medium and including a substrate and a wiring conductor provided on the substrate. The substrate includes an extension formed so as to outwardly extend from the body and the wiring conductor is formed so as to extend from an interior of the body to the extension of the substrate. The fluorescent display device also includes a semiconductor element arranged on the extension of the substrate and provided with metal bumps electrically connected to the wiring conductor, a face plate arranged so as to interposedly holding the semiconductor element between the face plate and the extension of the substrate, and a sealing material arranged between a periphery of the face plate and the extension of the substrate to form a mounting chamber in cooperation with the face plate and extension in which the semiconductor element is mounted. The sealing material is made of an organic material having an operating temperature lower than the sealing medium of the body.

In a preferred embodiment of the present invention, the sealing material is made of a material selected from the group consisting of low-melting metal and alloy thereof.

In a preferred embodiment of the present invention, the sealing material is made of a material selected from the group consisting of indium, a wire material of indium-tin alloy and a shaped product of indium-tin alloy.

In the present invention constructed as described above, the semiconductor element is arranged in the mounting chamber formed by cooperation of the face plate, sealing material and substrate while being kept isolated from an ambient atmosphere. Also, the semiconductor element is pressed against the substrate by the face plate, so that electrical connection between the metal bumps of the semiconductor element and the wiring conductor on the substrate may be positively carried out.

Also, resistance in the connection between both is significantly decreased due to a substantial decrease in thickness of the conductive member by pressing of the semiconductor element against the substrate by the face plate, irrespective of a manner of the connection.

BRIEF DESCRIPTION OF THE DRAWINGS

These and other objects and many of the attendant advantages of the present invention will be readily appreciated as the same becomes better understood by reference to the following detailed description when considered in connection with the accompanying drawings, wherein.

DETAILED DESCRIPTION OF THE PREFERRED EMBODIMENT

Now, a fluorescent display device according to the present invention will be described hereinafter with reference to the accompanying drawings.

Figure 1:
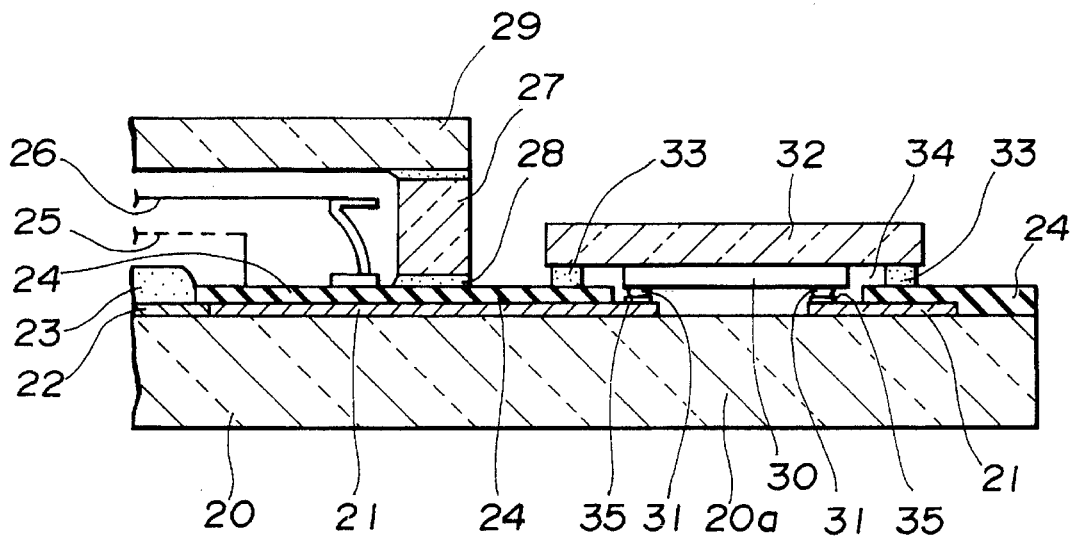
FIG. 1 is a fragmentary enlarged sectional view showing an essential part of an embodiment of a fluorescent display device according to the present invention.
Figure 2:
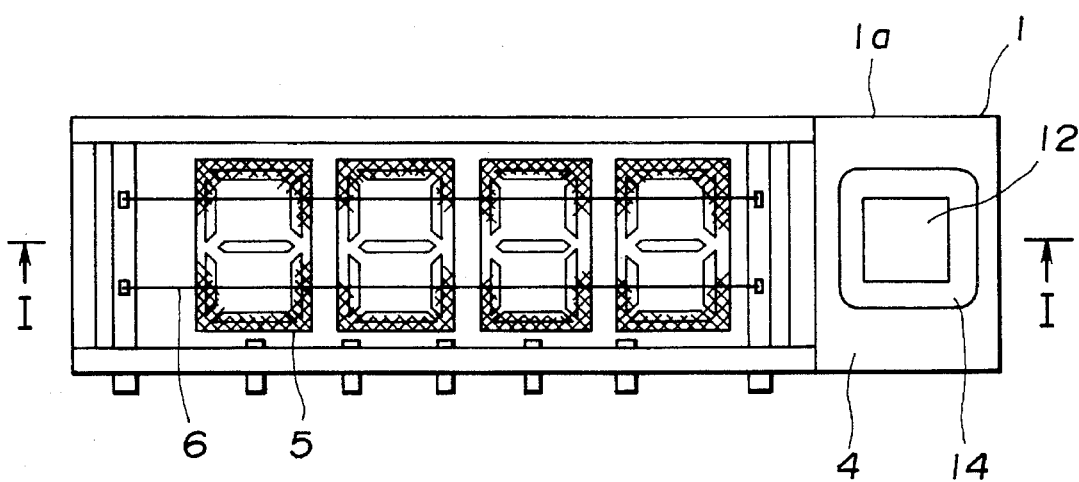
FIG. 2 is a plan view showing an example of a conventional fluorescent display device.
Figure 3:
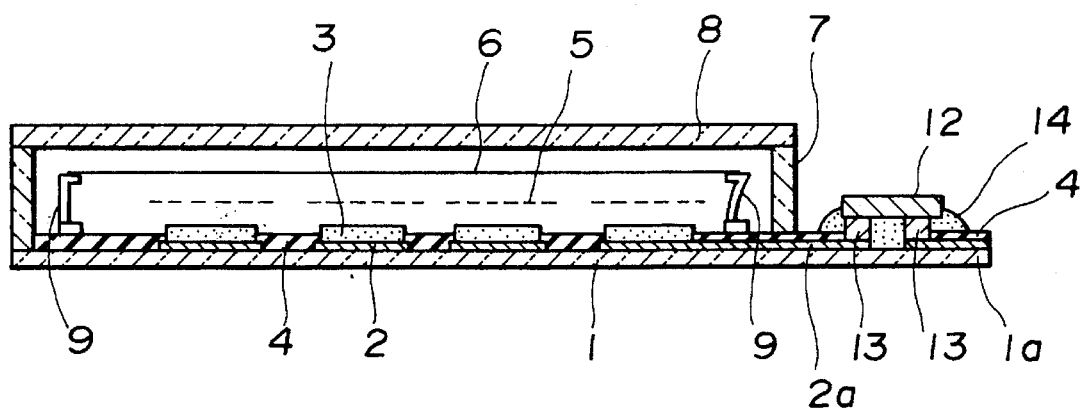
FIG. 3 is sectional view taken along line I—I of FIG. 2.

Referring to FIG. 1, an embodiment of a fluorescent display device according to the present invention is illustrated. A fluorescent display device of the illustrated embodiment includes a substrate 20 made of a glass plate and an anode conductor 22 arranged on an inner surface the substrate 20. The anode conductor 22 has phosphor layers 23 deposited on an inner surface thereof. The substrate 20 is also formed on the inner surface thereof with a wiring conductor 21 for feeding the anode conductor and other electrodes with an electric power. Further, an insulating layer 24 is arranged so as to cover the wiring conductor 21.

The fluorescent display device of the illustrated embodiment also includes control electrodes 25 and filamentary cathodes 26 arranged above the substrate 20. The substrate 20 is integrally joined to side plates 27 and a cover plate 29 by means of a sealing medium 28 such as low-melting frit glass or the like of which an operating or working temperature is about 400° C., resulting in a hermetic envelope which constitutes a body of the fluorescent display device being formed.

The substrate 20 is arranged so as to outwardly extend at a part thereof from the envelope, resulting in providing an extension 20a on which a semiconductor device 30 is to be mounted. Also, the wiring conductor 21 is arranged so as to extend to or across the extension 20a of the substrate 20 form an interior of the envelope. The wiring conductor 21 is covered at an upper surface thereof with the insulating layer 24 except portions thereof positionally corresponding to metal bumps 31 of the semiconductor element 30.

The metal bumps 31 are provided on a lower surface of the semiconductor element 30 and electrically connected through conductive members 35 to the wiring conductor 21. The semiconductor element 30 is so arranged that an upper surface thereof is abutted against an inner or lower surface of a face plate 32, resulting in being pressed against the substrate 20 by the face plate 32.

The face plate 32 is fixedly mounted on the substrate 20 by means of a sealing material 33 such as, for example, indium-tin alloy or the like which has an operating temperature lower than that of the sealing medium 28 described above. The sealing material 33 is arranged so as to surround the semiconductor element 30, so that a mounting chamber 34 is defined so as to isolate the semiconductor element 30 from an environment or an ambient atmosphere.

Now, the manner of mounting of the semiconductor element 30 and formation of the mounting chamber 34 will be described hereinafter.

The basic construction of the fluorescent display device or the internal electrodes are previously formed in the envelope and then sealing and evacuation of the envelope are carried out.

Then, the conductive member 35 in the form of a paste is applied to each of the metal bumps 31 of the semiconductor element 30. Subsequently, the semiconductor element 30 is mounted on the substrate 20 while being kept aligned with the wiring conductor 21 on the substrate 20, during which the semiconductor element 30 is held on the substrate 20 by adhesion of the conductive member 35. Also, a performance or function of the semiconductor element is checked while being kept mounted on the substrate 20.

Thereafter, the sealing material 33 is placed at each of predetermined sealing positions on the substrate 20. The sealing material 33 may comprise indium-tin alloy formed into a wire-like shape. Alternatively, it may be formed into any other suitable shape by melting the alloy in the form of powders. Then, alignment between the face plate 32 and the substrate 20 is carried out and then the face plate 32 and substrate 20 are heated to a temperature of about 200° C. using an oven, a heater for local heating, or the like while being pressed against each other by means of a clip or the like, leading to melting of the sealing material 33. Subsequently, the face plate 32 and substrate 20 are allowed to slowly cool, resulting in the mounting chamber 34 being formed.

Thus, in the fluorescent display device of the illustrated embodiment, the sealing material which is an inorganic material such as indium-tin alloy or the like cooperates with the face plate 32 to form the mounting chamber 34, in which the semiconductor element 30 is received.

Indium-tin alloy exhibits satisfactory conformability to a glass plate, so that the sealing material 33 serves to firmly fix the face plate 32 and substrate 20 to each other. Also, the sealing material 33 exhibits moisture resistance sufficient to provide the mounting chamber 34 with increased moisture resistance as compared with conventional sealing by resin. Also, this permits the mounting chamber 34 to be kept hermetic, so that the mounting chamber 34 may be kept at a high vacuum or at an inert atmosphere. Thus, the fluorescent display device of the illustrated embodiment is improved in corrosion resistance.

Further, in the fluorescent display device of the illustrated embodiment, the face plate 32 presses the semiconductor element 30 against the substrate 20, to thereby ensure positive electrical connection between each of the metal bumps 31 of the semiconductor element 30 and the wiring conductor 21. Also, the connection between each of the metal bumps 31 and the wiring conductor 21 is carried out through the conductive member 35 while being pressed against each other by the face plate 32, so that the conductive member 35 is highly decreased in thickness, leading to a decrease in resistance.

In addition, use of the indium-tin alloy permits the operating temperature of the sealing material 33 to be reduced to a level of about 200° C. which is significantly low as compared with the operating temperature of the sealing medium 28 used for forming the envelope of the fluorescent display device, so that formation of the mounting chamber 34 after completion of the body of the fluorescent display device does not cause any disadvantages such as re-melting of the sealing medium 28, generation of gas and the like which adversely affect the body of the fluorescent display device. Thus, the illustrated embodiment permits mounting of the semiconductor element 30 after it is confirmed that the body of the fluorescent display device is non-defective.

When any failure is found or occurs in the body of the fluorescent display device or the semiconductor element 30 after mounting of the semiconductor element 30, heating of the sealing material 33 to a temperature of about 200° C. permits the semiconductor element 30 to be readily removed from the fluorescent display device.

Moreover, a decrease in operating temperature of the sealing material 33 permits mounting of a component of low heat resistance such as a C-MOS, a memory or the like as well.

In the illustrated embodiment, indium-tin alloy is used for the sealing material. Alternatively, another kind of indium alloy, low-melting metal such as indium or the like and alloy thereof may be used for this purpose. Also, low-melting frit glass having an operating temperature as low as about 300° C. may be used for the sealing material 33.

Furthermore, in the illustrated embodiment, electrical connection between the wiring conductor and each of the metal bumps is carried out through the conductive member, so that the semiconductor element may be temporarily fixed on the substrate. Therefore, so far as the temporary fixing is accomplished, the wiring conductor and metal bump are directly connected to each other.

Also, in the illustrated embodiment, the face plate is formed of a glass plate. Alternatively, it may be formed of any other suitable material such as a metal plate, a ceramic material or the like in view of a thermal expansion coefficient of the sealing material. Further, in the illustrated embodiment, the semiconductor element 30 is pressed directly against the substrate. Alternatively, any suitable member may be interposedly arranged between the face plate and the semiconductor element.

As can be seen from the foregoing, the fluorescent display device of the present invention is so constructed that the semiconductor element is received in the mounting chamber which is formed of the sealing material of an inorganic material and the face plate on the support section of the substrate. Thus, the mounting chamber is improved in hermetic properties and moisture resistance as compared with conventional sealing by resin, because the sealing material comprises inorganic material.

Also, the semiconductor element is kept pressed against the substrate by the face plate, so that electrical connection between each of the metal bumps of the semiconductor element and the wiring conductor on the substrate may be positively carried out and resistance in the connection may be reduced.

Further, the sealing material used for formation of the mounting chamber has an operating temperature as compared with the sealing medium used for formation of the body of the fluorescent display device. This effectively prevents generation of residual gas, re-melting of the sealing medium and the like even when mounting of the semiconductor element is carried out after formation of the body of the fluorescent display device is completed.

Further, use of the sealing material permits removal and re-use of the semiconductor element even when any failure is found or occurs in the fluorescent display device after mounting of the semiconductor element. Also, use of the sealing material permits replacement of the semiconductor element while preventing generation of residual gas, even when any failure is found or occurs in the semiconductor element after completion of the fluorescent display device.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A fluorescent display device comprising:
   a body assembled by means of a sealing medium and including a substrate and a wiring conductor provided on said substrate;
   said substrate including an extension formed so as to outwardly extend from said body;
   said wiring conductor being formed so as to extend from an interior of said body to said extension of said substrate;
   a semiconductor element arranged on said extension of said substrate and provided with metal bumps electrically connected to said wiring conductor;
   a face plate arranged so as to interposedly holding said semiconductor element between said face plate and said extension of said substrate; and a sealing material arranged between a periphery of said face plate and said extension of said substrate to form a mounting chamber in cooperation with said face plate and extension in which said semiconductor element is mounted;

said sealing material being made of an in organic material having an operating temperature lower than said sealing medium of said body.

2. A fluorescent display device as defined in claim 1, wherein said sealing material is made of a material selected from the group consisting of low-melting metal and alloy thereof.

3. A fluorescent display device as defined in claim 1 or 2, wherein said sealing material is made of a material selected from the group consisting of indium, a wire of indium-tin alloy and an indium-tin material shaped from powder.

* * * * *